United States Patent [19]

Black

[11] 4,051,387
[45] Sept. 27, 1977

[54] HIGH SPEED ECL ONE-SHOT MULTIVIBRATOR

[75] Inventor: Stephen Read Black, Bountiful, Utah
[73] Assignee: Motorola, Inc., Schaumburg, Ill.
[21] Appl. No.: 701,722
[22] Filed: July 1, 1976
[51] Int. Cl.² .......................... H03K 3/10; H03K 5/04
[52] U.S. Cl. .................................. 307/273; 307/265; 328/58; 328/207
[58] Field of Search ................ 307/265, 273; 328/58, 328/207

[56] References Cited
U.S. PATENT DOCUMENTS

| | | | |
|---|---|---|---|
| 3,484,624 | 12/1969 | Rasiel et al. | 328/58 |
| 3,536,935 | 10/1970 | Watson, Jr. et al. | 328/207 |
| 3,576,496 | 4/1971 | Garagnon | 328/207 |
| 3,768,026 | 10/1973 | Pezzutti | 307/273 |
| 3,781,573 | 12/1973 | Weeden, Jr. | 307/273 |
| 3,820,029 | 6/1974 | McKinley | 328/58 |
| 3,999,085 | 12/1976 | Kelly et al. | 328/207 |
| 3,588,543 | 6/1971 | Schwartz | 307/265 |

FOREIGN PATENT DOCUMENTS

| | | | |
|---|---|---|---|
| 2,030,841 | 1/1971 | Germany | 328/207 |

OTHER PUBLICATIONS

"Logic Single Shot" by Petersen, IBM Tech Disclos. Bull, vol. 13, No. 8, Jan. 1971, pp. 2186-2187.

Primary Examiner—Stanley D. Miller, Jr.
Attorney, Agent, or Firm—Joe E. Barbee

[57] ABSTRACT

A versatile ECL one-shot having the following features: retriggerable, resettable, input trigger controllability, voltage controllability and a high speed input is provided which bypasses the input circuit for minimum output delay. The ECL one-shot includes an input circuit, a timing gate flip-flop, a retrigger gate flip-flop, and a timing circuit including an active recovery circuit for rapidly recharging a discrete external capacitor in a matter of a few nanoseconds after discharge.

9 Claims, 6 Drawing Figures

ENABLE INPUT TRUTH TABLE

| PIN +ENABLE 5 | PIN −ENABLE 10 | OPERATION MODE |
|---|---|---|
| 0 | 0 | TRIGGERS ON BOTH POSITIVE AND NEGATIVE INPUT SLOPES |
| 0 | 1 | TRIGGERS ON POSITIVE INPUT SLOPES |
| 1 | 0 | TRIGGERS ON NEGATIVE INPUT SLOPES |
| 1 | 1 | TRIGGER DISABLED |

HIGH SPEED ECL ONE-SHOT MULTIVIBRATOR

BACKGROUND OF THE INVENTION

1. Field of the Invention

This invention relates to one-shot logic circuits, and more particularly, to emitter coupled logic (ECL) one-shots.

2. Description of the Prior Art

Previously a high speed ECL one-shot has not been available on the market. Some transistor transistor logic (TTL) one-shot circuits have been available but the flexibility and features which they provided had been limited. The requirement for a versatile high speed ECL one-shot which was compatible with other ECL logic circuits has not been met by prior art circuits.

Prior art one-shots typically use RC timing circuits. Upon receiving a trigger pulse, these one-shot circuits pass through two cycles--a discharge cycle which initializes the charge on the timing capacitor via a relatively small internal resistance (typically 1.5k) and a timing cycle which charges the timing capacitor through a large external timing resistor to a threshold level which, when attained, terminates the timing pulse.

Circuits of this variety have not been able to offer a full retrigger capability because trigger pulses received during the discharge cycle are ignored. For short timing intervals, the discharge cycle is a significant portion of the timing cycle (up to 50%). Therefore, a considerable retrigger dead zone exists.

This circuit of the present invention accepts a trigger pulse at any time by storing the trigger pulses occurring during the timing interval as retrigger pulses on a separate retrigger flip-flop thereby giving the circuit a full retrigger capability.

This same inability to quickly restore the charge on the timing capacitor prevented prior art one-shots from being immediately able to receive a subsequent input signal after a reset signal had been received. Prior art one-shot circuits typically were not able to receive an additional input signal until the RC timing circuit had been timed out in a normal manner.

Therefore, it is a feature of this invention to provide a versatile, high speed ECL one-shot circuit which is fully retriggerable such that any continuous input pulse train faster than the output pulse width will cause the one-shot output pulse to continue until one pulse width after the last input pulse.

It is another feature of this invention to provide a high speed, versatile ECL one-shot which is resettable such that the reset input terminates the output pulse and immediately restores the timing capacitor charged to initial conditions.

It is yet another feature of the present invention to provide a versatile, high speed ECL one-shot providing logic input trigger controllability which determines whether the one-shot triggers on positive edges, negative edges, both, or neither.

It is still another feature of this invention to provide a versatile, high speed ECL one-shot with current controllability such that an external current can control the output pulse width.

It is yet another feature of this invention to provide a versatile, high speed ECl one-shot having an input buffered by Schmidt triggers to enhance the timing accuracy for inputs having slow rise and fall times.

It is still another feature of this invention to provide a versatile, high speed ECL one-shot having a high speed input which bipasses the input Schmidt triggers for minimum input to output delay operation.

SUMMARY OF THE INVENTION

A preferred embodiment of the present invention includes an input circuit and timing gate flip-flop means having a first input terminal coupled to the input circuit for generating a first digital control signal. A retrigger gate flip-flop has a second input terminal which is coupled to the input circuit and generates a second digital control signal. A timing circuit is responsive to the first and second digital control signals and is also coupled to a third input terminal for controlling the output pulse length of the one-shot. An output gate is coupled to the input circuit and to the first and second digital control signals for generating a one-shot logic circuit output signal.

The ECL one-shot logic circuit is an integrated circuit which is retriggerable, resettable, and features input trigger controllability and voltage controllability. In addition, a high speed input is also provided which bypasses the input circuit for minimum output delay operation.

BRIEF DESCRIPTION OF THE DRAWINGS

The invention is pointed out with particularity in the appended claims. However, other objects and advantages, together with the operation of the invention, may be better understood by reference to the following detailed description taken in connection with the following illustrations wherein:

DESCRIPTION OF THE PREFERRED EMBODIMENT

Figures 1, 2:
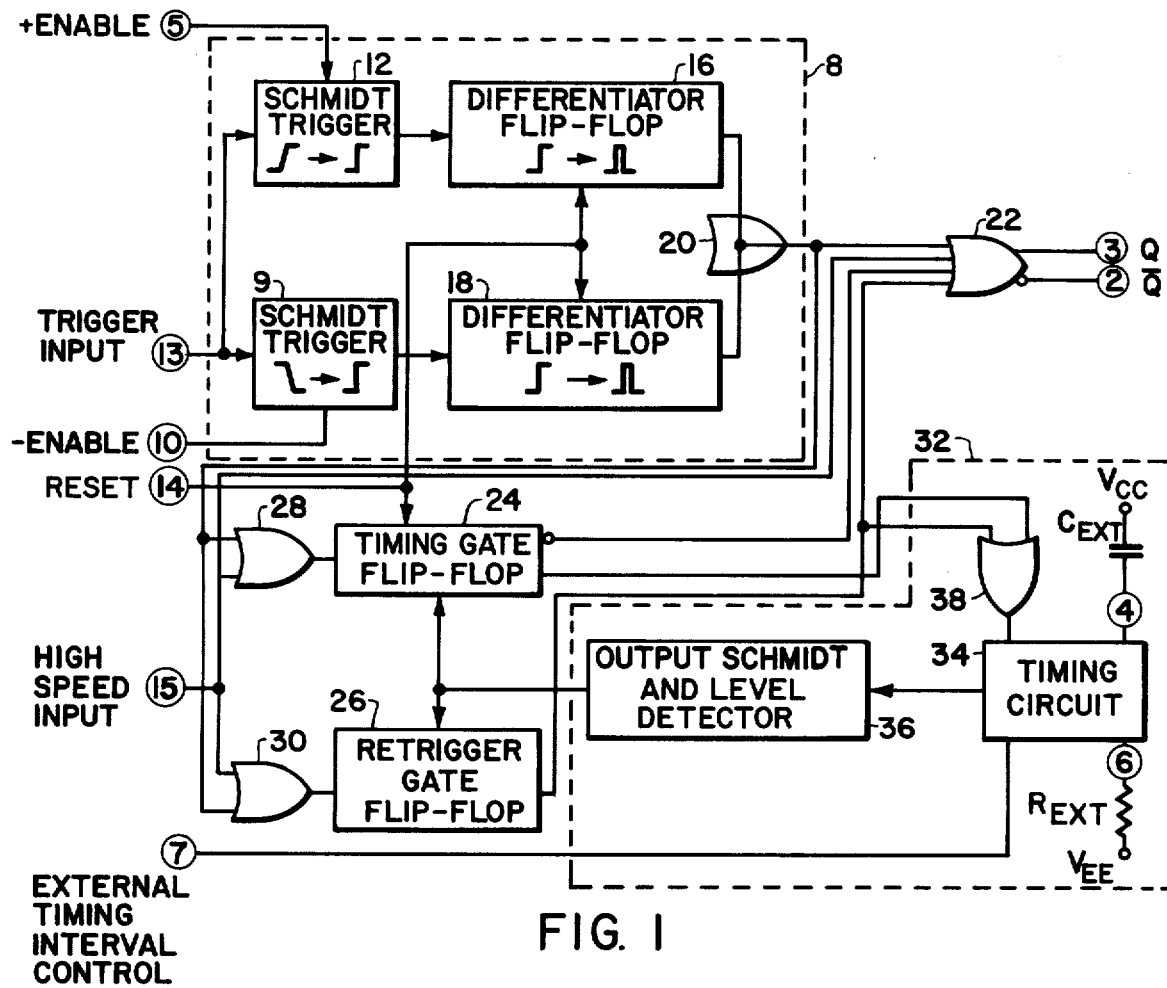
FIG. 1 is a generalized block diagram of the versatile, high speed ECL one-shot.
FIG. 2 is an enable input truth table for the input circuit of the ECL one-shot.

Now referring to the drawings and first to FIG. 1, an ECL one-shot is shown which comprises and input circuit means 8. A trigger input signal is coupled to the input of Schmidt trigger 12 an Schmidt trigger 9. The output of Schmidt trigger 12 is coupled to the input of differentiator flip-flop 16 and the output of Schmidt trigger 9 is coupled to the input of differentiator flip-flop 18. The outputs of differentiator flip-flops 16 and 18 are wire ORed by OR gate 20, the output of which is coupled to an output gate 22.

The output of OR gate 20 is further coupled to the input of timing gate flip-flop 24 and to the input of retrigger gate flip-flop 26. Input signals are coupled to the input of timing gate flip-flop 24 through an OR gate 28. Input signals are coupled to retrigger gate flip-flop 26 through an OR gate 30.

The ECL one-shot further includes a timing circuit means 32 consisting of timing circuit 34 and output Schmidt and level detector 36. Input signals are coupled to timing circuit 34 through OR gate 38. External discrete components consisting of capacitor $C_{EXT}$ and resistor $R_{EXT}$ are coupled to circuitry internal to timing circuit 34.

Figure 4A:
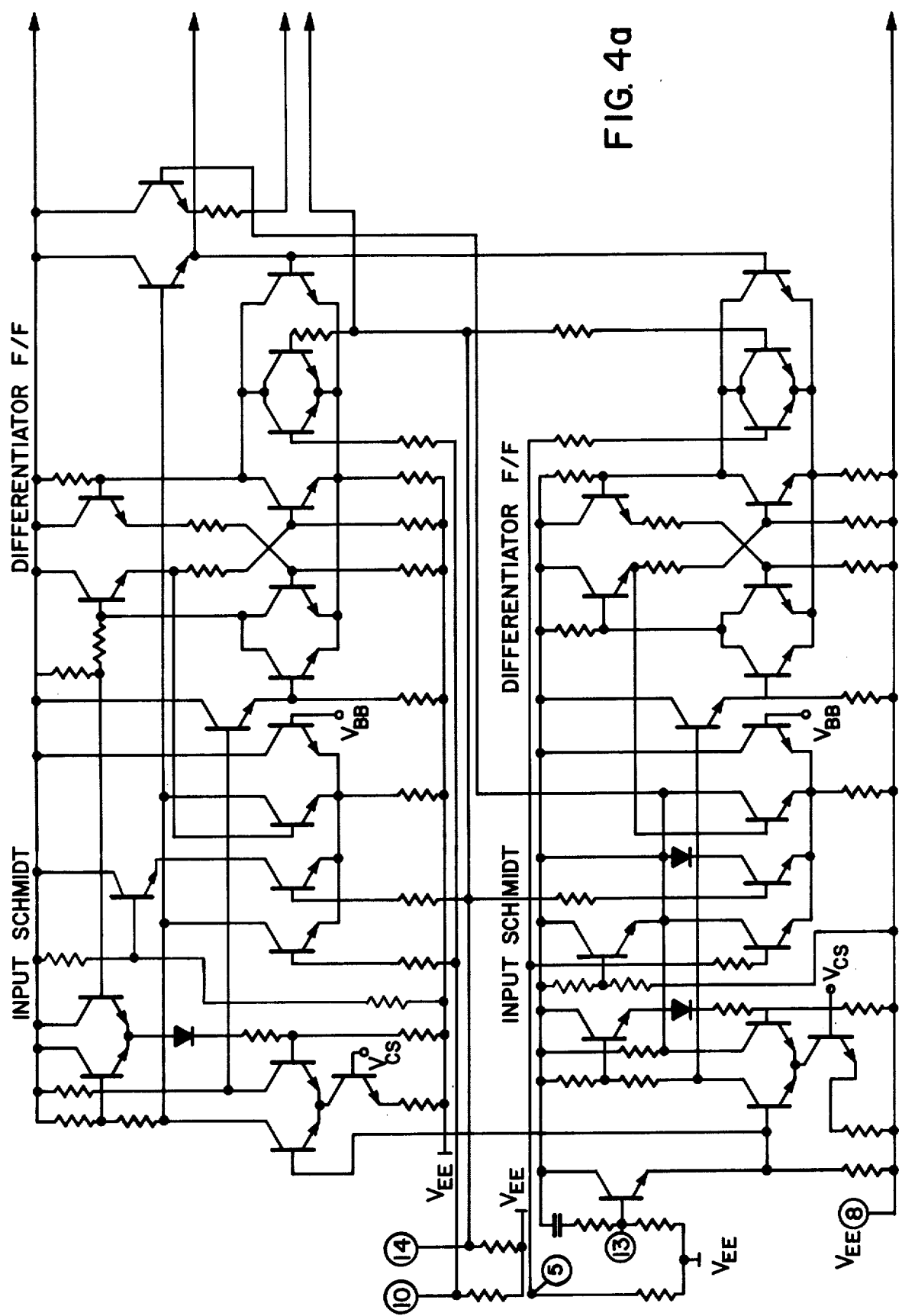
FIGS. 4a and 4b are a specific schematic diagrams of a preferred hardware embodiment of the ECL one-shot.
Figure 4B:
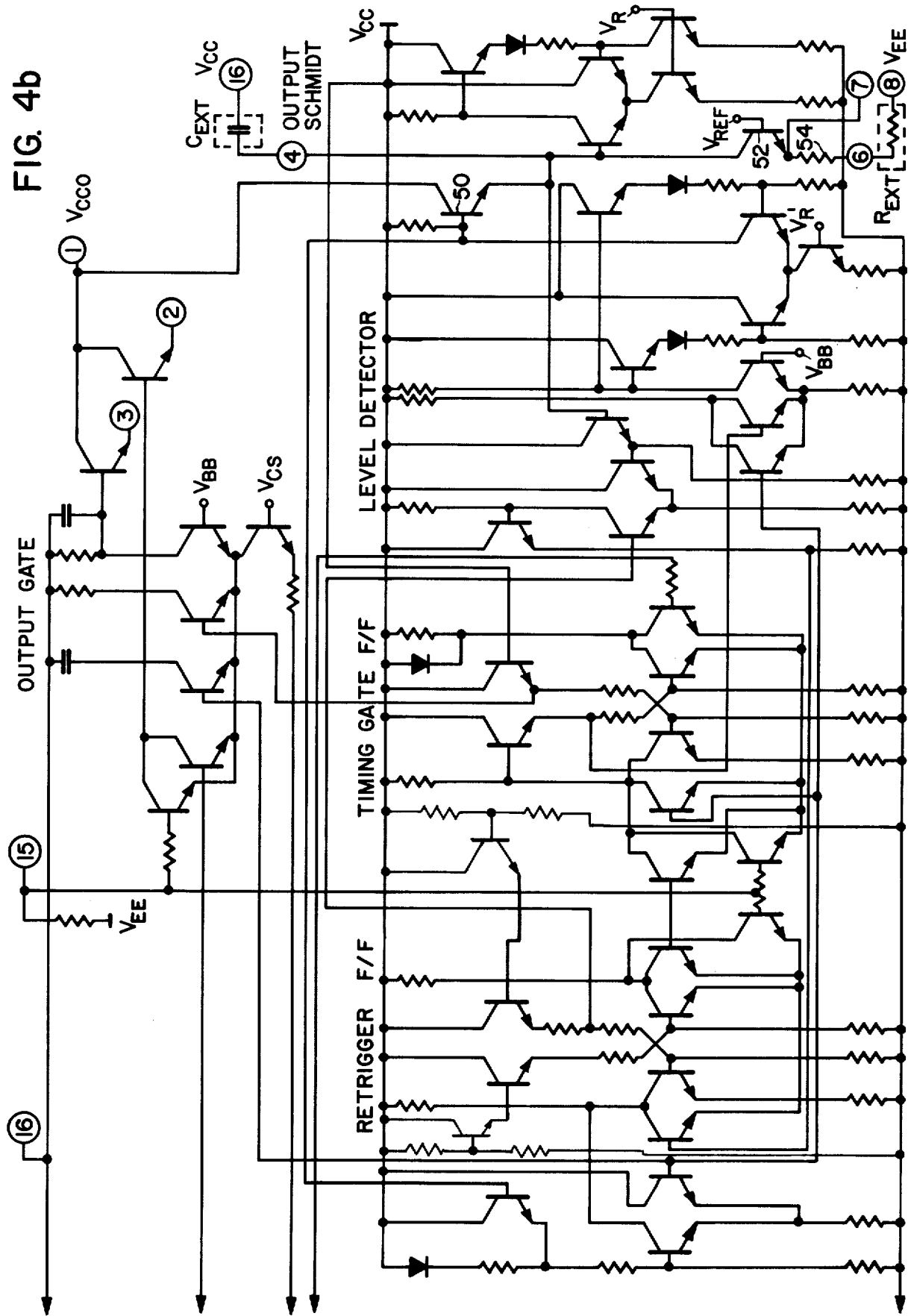

In FIGS. 1 and 4 various input, output and control conductors associated with an integrated circuit embodiment of the ECL one-shot are shown by numbers lying inside circles which represent the pin number of the integrated circuit.

The trigger input signal is received on pin 13 which couples input signals to Schmidt triggers 12 and 9. The ECL one-shot circuit provides input trigger controllability through the + and − input enable signals which are coupled to Schmidt triggers 12 and 9 on + enable pin 5 and − enable pin 10.

FIG. 2 is a truth table indicating the operational mode for various binary control signals on + enable pin 5 and − enable pin 10. These enable signals determine whether the one-shot will trigger on positive edges, negative edges, both, or neither. This provides a great deal of flexibility for the user of this circuit. Schmidt trigger circuit 12 is designed to generate a fast rise time edge from positive going input edges and Schmidt trigger 9 generates a fast rise time edge from negative going input edges.

Figure 3:
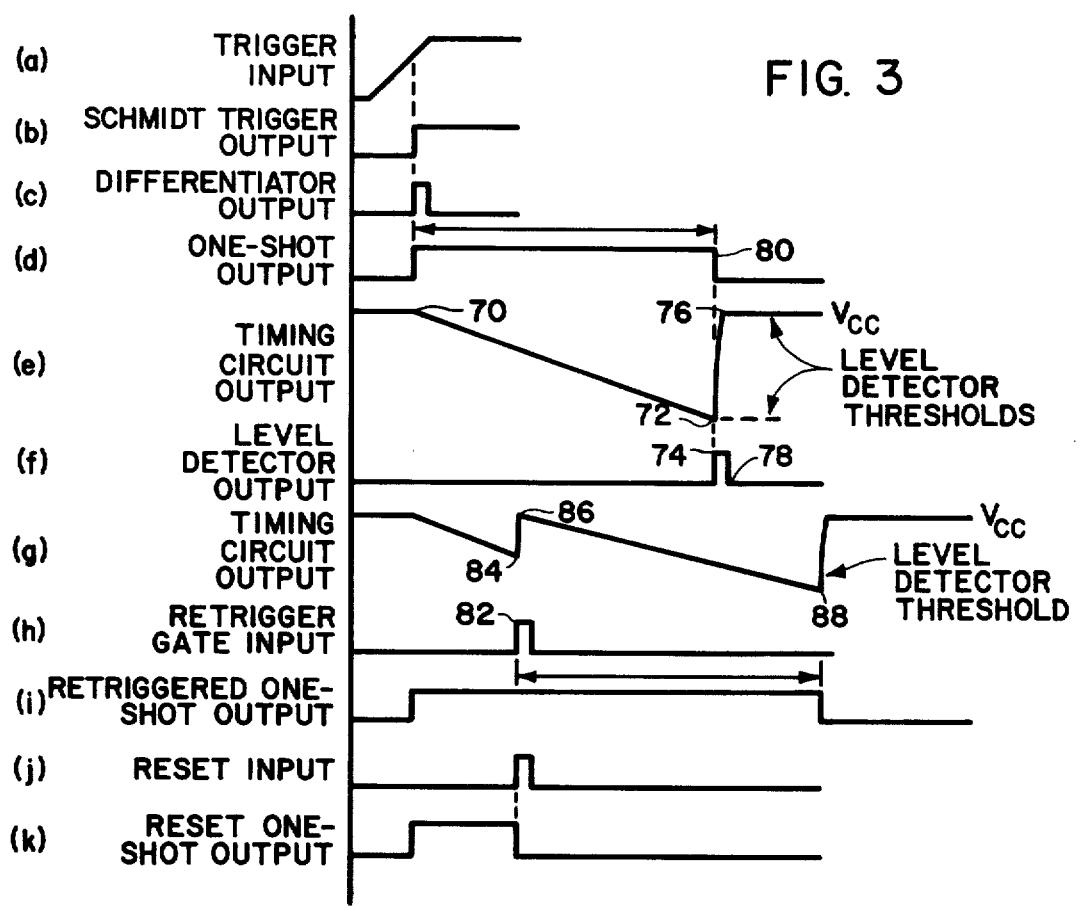
FIG. 3 is a timing diagram of the ECL one-shot illustrating particular waveforms of the various circuit elements of the ECL one-shot.

FIG. 3a illustrates a positive going trigger input waveform and shows the resulting fast rise time edge output signal in FIG. 3b which is generated by Schmidt trigger 12.

This fast rise time edge from Schmidt trigger 12 is applied to differentiator flip-flop circuit 16 which converts the edge to a narrow pulse approximately 2 nanoseconds in duration. FIG. 3c illustrates the narrow pulse output from differentiator 16 in response to the Schmidt trigger output shown in FIG. 3b. The narrow differentiator flip-flop output pulses are wire ORed by OR gate 20 and applied as triggers to other circuits in the ECL one-shot.

The high speed input on pin 15 operates upon the ECL one-shot circuitry in the same manner as the differentiator pulses produced at the output of the input circuit means 8. This gives the user the option of bypassing the input circuit means pulse forming networks and thereby reducing the input-output delay time.

The narrow differentiator pulse (or the high speed input pulse) simultaneously is applied to output gate 22 which immediately generates a high level digital signal at pin 3 of the integrated circuit device. Simultaneously, this narrow differentiator pulse sets either the timing gate flip-flop 24 or the retrigger gate flip-flop 26. The existing output state of the ECL one-shot determines whether flip-flop 24 or 26 will be set in response to this input pulse. If the one-shot is not in the process of timing out or recovering from the timing pulse (i.e., restoring the charge on the external timing capacitor to quiescent conditions), the retrigger flip-flop 26 is disabled and the timing gate flip-flop 24 is set in response to the differentiator output pulse.

Figure 5:
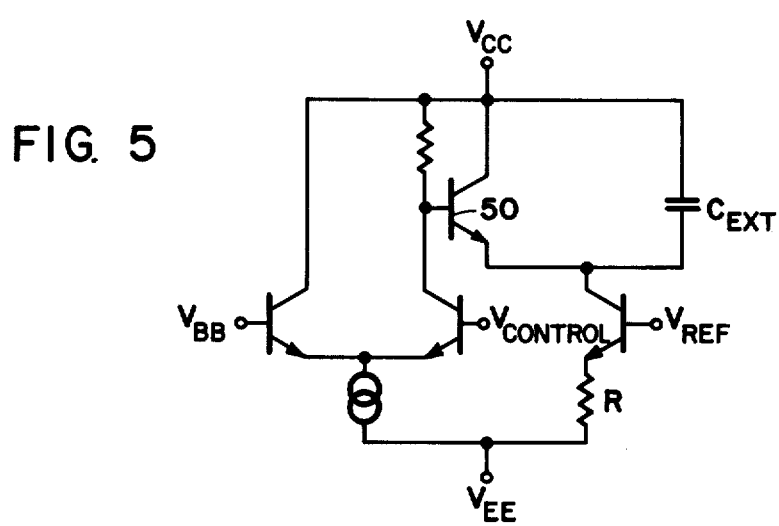
FIG. 5 is a simplified schematic diagram of the timing circuit of the ECL one-shot.

The timing gate flip-flop 24 output enables the retrigger gate flip-flop 26 and shuts off the recharge transistor (transistor 50 as shown in FIGS. 4 and 5). As a result the current source timing circuit, a slightly simplified schematic diagram of which is shown in FIG. 5, begins to remove current from the external timing capacitor $C_{EXT}$ thereby causing the voltage on $C_{EXT}$ to begin to linearly ramp down. Reference number 70 in FIG. 3e illustrates the point at which the external timing capacitor voltage begins to ramp down.

The external timing capacitor voltage continues to drop until it reaches the voltage shown at reference number 72 in FIG. 3e. This voltage level corresponds to the lower level detector threshold in the output Schmidt and level detector circuit 36. Upon detecting this voltage threshold, level detector 36 generates an output pulse shown in FIG. 3f beginning at reference number 74.

The active recovery circuit illustrated in FIG. 5 is simultaneously triggered to virtually immediately return the charge on the external capacitor to its quiescent condition. The voltage on the external capacitor returns to the level shown by reference number 76 in FIG. 3e. When the charge on the external capacitor reaches this value the level detector senses it and returns to its original state as is shown by reference number 78. In this manner level detector 36 generates a high level output pulse when the external timing capacitor reaches its lower threshold level and generates a low level output pulse when $C_{EXT}$ reaches its upper threshold or normal quiescent condition.

Upon receipt of the initial level detector rising edge shown at reference number 74, timing gate flip-flop 24 immediately changes state from a high level to a low level. This change in state is coupled to output gate 22 which immediately shifts Q from a high level output to a low level output as is shown at reference numeral 80 in FIG. 3d.

The retrigger gate flip-flop 26 functions to control the ECL circuit such that any continuous input pulse train faster than the output pulse width or any input pulse occurring during the timing cycle causes the one-shot output pulse to continue until one pulse width after the last input pulse. The operation of this retriggerable feature is illustrated in FIGS. 3g, h, and i. Let us assume that a second input pulse arrives at a point subsequent in time to a first input pulse such that the Q output of the one-shot is still at a high level. If this is a slow speed input signal it will be coupled to trigger input pin 13 and the input circuit means 8 will cause a high speed digital pulse to be coupled to the retrigger gate flip-flop 26. This input pulse to the retrigger gate 26 is illustrated in FIG. h, at reference number 82. At this point in time the output voltage from timing circuit 34 will have begun to ramp downward and will be at a voltage level indicated by reference number 84. Upon receipt of the input pulse shown at reference number 82, retrigger gate flip-flop 26 will immediately change state. This high level digital output signal is coupled through OR gate 38 to the input of timing circuit 34. The active recovery circuit incorporated in timing circuit 34 will function to virtually instantaneously return the charge on the external timing capacitor to initial conditions. This will return the output of timing circuit 34 to a level shown at reference number 86. The output of retrigger gate flip-flop 26 is also coupled to output gate 22 such that the output signal on pin 3 will remain at a high level.

The active recharge circuit illustrated in FIG. 5 returns the charge on the external capacitor to quiescent conditions is a matter of nanoseconds. This recharge is indicated by the near vertical line between reference numbers 84 and 86 since only a few nanoseconds are required to recharge the capacitor. After the point shown at reference number 86 the timing circuit 34 once again begins to generate an output ramp voltage until the lower threshold detector level is reached at reference number 88. FIG. 3i illustrates the effect of the receipt of a second input pulse which causes the retrigger flip-flop to be operated.

When a reset signal is applied to reset pin 14 this signal is coupled to differentiator flip-flops 16 and 18 such that they are disabled and cannot conduct input pulses into the ECL one-shot circuitry. This reset signal further is coupled to the timing gate flip-flop 24 which disables it from receiving additional input signals. The reset input pulse to the timing gate flip-flop 24 also resets it. This altered output signal from timing gate flipflop 24 is coupled through OR gate 38 to timing circuit 34 which causes it to immediately restore the quiescent charge on the external timing capacitor.

The effect of a reset input is illustrated in FIG. 3*j* and *k*. The Q output from output gate 22 immediately goes to a low level state. Due to the operation of the active recovery circuit, after a delay of 2 or 3 nanoseconds the ECL one-shot is ready to receive an additional input pulse. This is quite distinct from prior art circuits which utilize RC timing circuitry since after the receipt of a reset input pulse the RC timing circuitry must be fully timed out before the one-shot is prepared to generate a subsequent output pulse. The output from prior art one-shots does immediately drop to a low level state after receiving a reset signal, but it must be emphasized that one-shots of this prior art design are not immediately able to receive an input pulse following a reset signal. Due to the high speed operation of the active recovery circuit of the present invention the external timing capacitor is virtually instantaneously returned to quiescent conditions following a reset signal and is ready for a subsequent input pulse.

FIG. 1 shows an external timing interval control input which is coupled to timing circuit 34 by pin 7. This allows provision for an external control of the ECL one-shot output pulse width. In this manner the output pulse width can be varied and can also be controlled with a high degree of accuracy. When a control signal is applied to pin 7 the external resistor which is connected to pin 6 is no longer required. FIG. 4 shows that the external control current on pin 7 is coupled to the emitter of a transistor 52.

The external resistor and resistor 54 function together to control the amount of current which flows in the active recovery circuit. This helps to determine the rate at which the external capacitor will be timed out and is part of the current source timing circuit illustrated in FIG. 5. In FIG. 5 the resistor designated as resistor R in reality consists of both the external resistor and resistor 54.

In order to provide very precise temperature tracking and to eliminate errors in the output pulse length with changes in temperature, a bias driver circuit is also incorporated within the ECL one-shot. Referring to FIG. 4, voltages $V_R$ and $V_{REF}$ vary in a special manner with temperature to provide a constant output pulse width with changes in temperature.

It should be emphasized that the output wave shape from timing circuit 34 is a ramp. This is quite distinct from prior art RC timing circuits which exhibit the familiar exponential output waveform. Having a ramped output of the type embodied in this ECL one-shot circuit allows more precise control of the duration of the output waveform.

It will be apparent to those skilled in the art that the disclosed design of an ECL one-shot may be modified in numerous ways and may assume many embodiments other than the preferred form specifically set out and described above. Accordingly, it is intended by the appended claims to cover all such modifications of the invention which fall within the true spirit and scope of the invention.

What is claimed is:

1. An ECL one-shot logic circuit comprising:
    a. input circuit means for receiving input signals and having at least one output,
    b. timing gate flip-flop means having a first input terminal coupled to said at least one output of said input circuit means and generating a first digital control signal,
    c. retrigger gate flip-flop means having a second input terminal coupled to said at least one output of said input circuit means and generating a second digital control signal,
    d. timing circuit means coupled to and being responsive to said first and second digital control signals for providing an output which is coupled to said timing gate flip-flop means and said retrigger gate flip-flop means for controlling output pulse length of said one-shot, and
    e. output gate means for generating an output for said one-shot logic circuit and being responsive to and coupled to said input circuit means and to said first and second digital control signals.

2. An ECL one-shot logic circuit according to claim 1 wherein said input circuit means includes a Schmidt trigger circuit and a differentiator flip-flop circuit coupled to said Schmidt trigger circuit.

3. An ECL one-shot logic circuit according to claim 2 wherein said input circuit means further includes a second Schmidt trigger circuit, a second differentiator flip-flop, and a wire ORed gate coupled to said first and second differentiator flip-flops.

4. An ECL one-shot logic circuit according to claim 3 wherein said first and second Schmidt triggers are coupled to receive a plus enable signal and a minus enable signal respectively for enabling said first and second Schmidt triggers.

5. An ECL one-shot logic circuit according to claim 4 wherein said timing circuit means includes a timing circuit and an output Schmidt and level detector means coupled to the output of said timing circuit.

6. An ECL one-shot logic circuit according to claim 5 wherein said timing circuit includes a discrete external capacitor.

7. An ECL one-shot logic circuit according to claim 6 wherein said timing circuit includes an external discrete resistor.

8. An ECL one-shot logic circuit according to claim 7 wherein said timing circuit means includes said timing circuit coupled to a third input terminal means and being responsive to an external timing interval control signal on said third input terminal means for altering the output pulse length of said one-shot.

9. An ECL one-shot logic circuit according to claim 8 wherein said input means includes high speed input terminal means for directly coupling an input signal through said input means.

* * * * *